(12) United States Patent
Ota et al.

(10) Patent No.: US 9,385,150 B2
(45) Date of Patent: Jul. 5, 2016

(54) IMAGE SENSOR DEVICE

(71) Applicant: Mitsubishi Electric Corporation, Chiyoda-ku (JP)

(72) Inventors: Akira Ota, Chiyoda-ku (JP); Taku Matsuzawa, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/433,739

(22) PCT Filed: Oct. 17, 2013

(86) PCT No.: PCT/JP2013/006171
§ 371 (c)(1),
(2) Date: Apr. 6, 2015

(87) PCT Pub. No.: WO2014/061274
PCT Pub. Date: Apr. 24, 2014

(65) Prior Publication Data
US 2015/0249104 A1    Sep. 3, 2015

(30) Foreign Application Priority Data

Oct. 18, 2012  (JP) ................................. 2012-231051
Mar. 7, 2013   (JP) ................................. 2013-045670

(51) Int. Cl.
*H04N 1/12*    (2006.01)
*H01L 27/146*  (2006.01)
(Continued)

(52) U.S. Cl.
CPC ............. *H01L 27/14629* (2013.01); *G01J 1/42* (2013.01); *G03B 27/54* (2013.01); *G07D 7/12* (2013.01);
(Continued)

(58) Field of Classification Search
CPC ....... H01L 27/14629; G01J 1/42; G07D 7/12; G07D 7/121; G03B 27/54; H04N 1/028; H04N 1/04; H04N 1/0318; H04N 1/1215; H04N 1/2034
See application file for complete search history.

(56) References Cited

U.S. PATENT DOCUMENTS 7,859,726 B2 *  12/2010  Endo .................. G07D 7/121
                                           358/474
7,978,379 B2 *   7/2011  Fujiuchi ............ H04N 1/02815
                                           358/475
(Continued)

FOREIGN PATENT DOCUMENTS

JP    09 261409      10/1997
JP    2009 135914     6/2009
(Continued)

OTHER PUBLICATIONS

International Search Report Issued Dec. 24, 2013 in PCT/JP13/006171 filed Oct. 17, 2013.
(Continued)

*Primary Examiner* — Tony Ko
(74) *Attorney, Agent, or Firm* — Oblon, McClelland, Maier & Neustadt, L.L.P.

(57) ABSTRACT

An image sensor and image sensor device include: a lighting portion extending in a main scanning direction and emitting light to the object-to-be-read; a rod lens array for imaging light from the object-to-be-read; and a light receiving portion for converting the light imaged by the rod lens array to an electric signal. The lighting portion emits a normally directed light from the normal direction of the object-to-be-read to irradiate a first irradiation region of the object-to-be-read, and an inclined light inclined by a predetermined angle from the normal direction of the object-to-be-read to irradiate a second irradiation region being apart from the first irradiation region in a sub-scanning direction.

17 Claims, 15 Drawing Sheets

(51) Int. Cl.
*G07D 7/12* (2016.01)
*H04N 1/031* (2006.01)
*G03B 27/54* (2006.01)
*H04N 1/028* (2006.01)
*H04N 1/04* (2006.01)
*G01J 1/42* (2006.01)
*H04N 1/203* (2006.01)

(52) U.S. Cl.
CPC ............... *G07D 7/121* (2013.01); *H04N 1/028* (2013.01); *H04N 1/0318* (2013.01); *H04N 1/04* (2013.01); *H04N 1/1215* (2013.01); *H04N 1/2034* (2013.01)

(56) References Cited

U.S. PATENT DOCUMENTS

| | | | |
|---|---|---|---|
| 9,117,322 B2* | 8/2015 | Hamasaki | ................ G06K 9/00 |
| 2007/0216976 A1 | 9/2007 | Endo et al. | |
| 2009/0109500 A1 | 4/2009 | Hasegawa et al. | |
| 2009/0310193 A1 | 12/2009 | Endo et al. | |
| 2011/0044059 A1 | 2/2011 | Inoue et al. | |
| 2011/0216541 A1 | 9/2011 | Inoue et al. | |
| 2011/0228359 A1 | 9/2011 | Tokida et al. | |

FOREIGN PATENT DOCUMENTS

| | | |
|---|---|---|
| JP | 4424360 | 3/2010 |
| JP | 2011 044336 | 3/2011 |
| JP | 2011 182370 | 9/2011 |
| JP | 2011 188231 | 9/2011 |

OTHER PUBLICATIONS

Extended European Search Report mailed May 4, 2016 in European Patent Application No. 13847212.1.

Office Action mailed Apr. 26, 2016 in Japanese Patent Application No. 2014-541953 (with English Translation).

* cited by examiner

IMAGE SENSOR DEVICE

TECHNICAL FIELD

The present disclosure relates to an image sensor and an image sensor device that read an image of a reading object (object-to-be-read) having a portion that reflects light, and a portion that transmits light.

BACKGROUND ART

A paper leaf such as a currency note, negotiable securities, and the like having a portion that reflects light, and a portion that transmits light, can be read using a photo sensor. For example, a reader for reading a paper leaf using a photo sensor performs a reading process in accordance with the following operations. First, spectra having different wavelengths from one another are emitted towards a paper leaf. Then, the reader detects optical information on the paper leaf by reading reflected light information from the emitted light reflected by the paper leaf and transmitted light information. Truth or false verification of currency notes, determination of the degree of deterioration during distribution and the like are performed from the detected optical information. An optical detector that provides a reader with such optical information is configured to have a lighting system that illuminates a paper leaf, an imaging system that images the reflected light or the transmitted light from a paper leaf, photoelectric conversion elements that convert imaged optical information to an electrical signal and the like. In recent years, the detection information amount to be processed in an optical detector has been increasing exponentially on the background that the demand for currency note, verification has been increasing and other reasons.

CITATION LIST

Patent Literature

Patent Literature 1: Japanese Patent No. 4424360

SUMMARY OF INVENTION

Technical Problem

Various optical specifications are required for an optical detector that provides a reader with optical information. That is, a detection specification is determined according to combinations of one-side information and two-side information, or reflected light information and transmitted light information on an object-to-be-read. When dedicated development is performed individually for various reading specifications, a problem of development cost increase is present. Especially when both the reflected light information and transmitted light information on an object-to-be-read need to be detected, detection mechanisms dedicated to each of the reflected light information and the transmitted light information need to be installed, and this tends to result in a large-sized detector and a cost increase compared with other applications using a photo sensor (for example, a copying machine that may detect only reflected light information, and the like).

Thus, for example, Patent Literature 1 discloses an image sensor that includes a lighting system for reading reflected light information, an imaging system, a photoelectric conversion element, and the like on one side of an object-to-be-read. In addition, Patent Literature 1 discloses that, on the other side of the object-to-be-read, a dedicated lighting unit whose optical axis of irradiation is aligned with the optical axis of the image formation of the above-mentioned image sensor (that is, the image sensor arranged on one side of the object-to-be-read) is arranged. The above-mentioned image sensor illuminates the object-to-be-read using its own lighting system, and obtains reflected light information by forming an image on a photoelectric conversion element using the reflected light from the object-to-be-read. In addition, an example is shown in which the above-mentioned image sensor obtains the transmitted light information by designing so that part of light beam, with which the above-mentioned dedicated lighting unit illuminates the object-to-be-read, passes through or is scattered at the object-to-be-read, and reaches the photoelectric conversion element via the imaging lens of the image sensor. In order to obtain both the reflected light information and the transmitted light information, these examples have respective dedicated lighting systems corresponding to the reflected light information and transmitted light information, while the imaging system, a photoelectric conversion element, and the like are designed to be shared and used. This configuration can obtain a highly versatile optical detector with a good space factor.

However, in the structure described in Patent Literature 1, when the reflected light information on both sides of an object-to-be-read and the transmitted light information from both sides of the object-to-be-read are required, one image sensor and one light source dedicated to transmission are required on both sides of the object-to-be-read, and the optical detector occupies a large area. This leads to a problem of causing the size of the whole reader apparatus to increase. Moreover, a gap or a level difference cannot be avoided between the image sensor and the dedicated lighting unit on each side. Therefore, when there are a crease and/or wrinkles at the tip of the object-to-be-read, a problem occurs in which the tip of the object-to-be-read is caught in the gap or the level difference during conveying the object-to-be-read, causing conveyor failures due to a paper jam, or giving a damage to the paper leaf or the conveyor.

An objective of the present disclosure is to solve the above-described problems. That is, the objective of the present disclosure is to obtain a small-sized and highly versatile image sensor device that is capable of obtaining reflected light information of both sides of an object-to-be-read and transmitted light information from both sides of the object-to-be-read and has a short length in conveying direction while ensuring conveying quality.

Solution to Problem

An image sensor device of the present disclosure includes a pair of image sensors, each of the image sensors including: a lighting portion extending in a main scanning direction and irradiating light onto an object-to-be-read; a rod lens array for imaging light from the object-to-be-read; and a light receiving portion for converting the light imaged by the rod lens array to an electric signal, wherein the lighting portion emits a normally directed light from a normal direction of the object-to-be-read to irradiate a first irradiation region of the object-to-be-read, and an inclined light inclined by a predetermined angle from the normal direction of the object-to-be-read to irradiate a second irradiation region being apart from the first irradiation region in a sub-scanning direction. The pair of the image sensors are arranged point-symmetrically around an axis in the main scanning direction facing across the object-to-be-read, and an optical axis of reflected light that is the inclined light of one image sensor reflected on the object-to-be-read, coincides with an optical axis of transmission light, that is, the normally directed light of the other image sensor transmitted through the object- to-be-read. The lighting portion of one image sensor irradiates light at a timing different from the irradiating of the lighting portion of the other image sensor. The light receiving portion of the one image sensor converts the reflected light and the light receiving portion of the other image sensor converts the transmission light during irradiation of light by the lighting portion of the one image sensor.

Advantageous Effects of Invention

One can obtain a small-sized and highly versatile image sensor device that is capable of obtaining reflected light information of both sides of an object-to-be-read and transmitted light information from both sides of the object-to-be-read and has a short length in conveying direction while ensuring conveying quality of the object-to-be-read.

DESCRIPTION OF EMBODIMENTS

The embodiments of the present disclosure are explained in an example in which the reading object (object-to-be-read) of an image sensor and image sensor device is a paper leaf such as a currency note, negotiable securities, and a check. The present disclosure can be performed when the reading object (object-to-be-read) has a light reflecting portion and a light transmitting portion. In the diagrams, the same reference signs denote the equivalent or corresponding portion, and the detailed explanation thereof is omitted.

Embodiment 1

Figure 1:
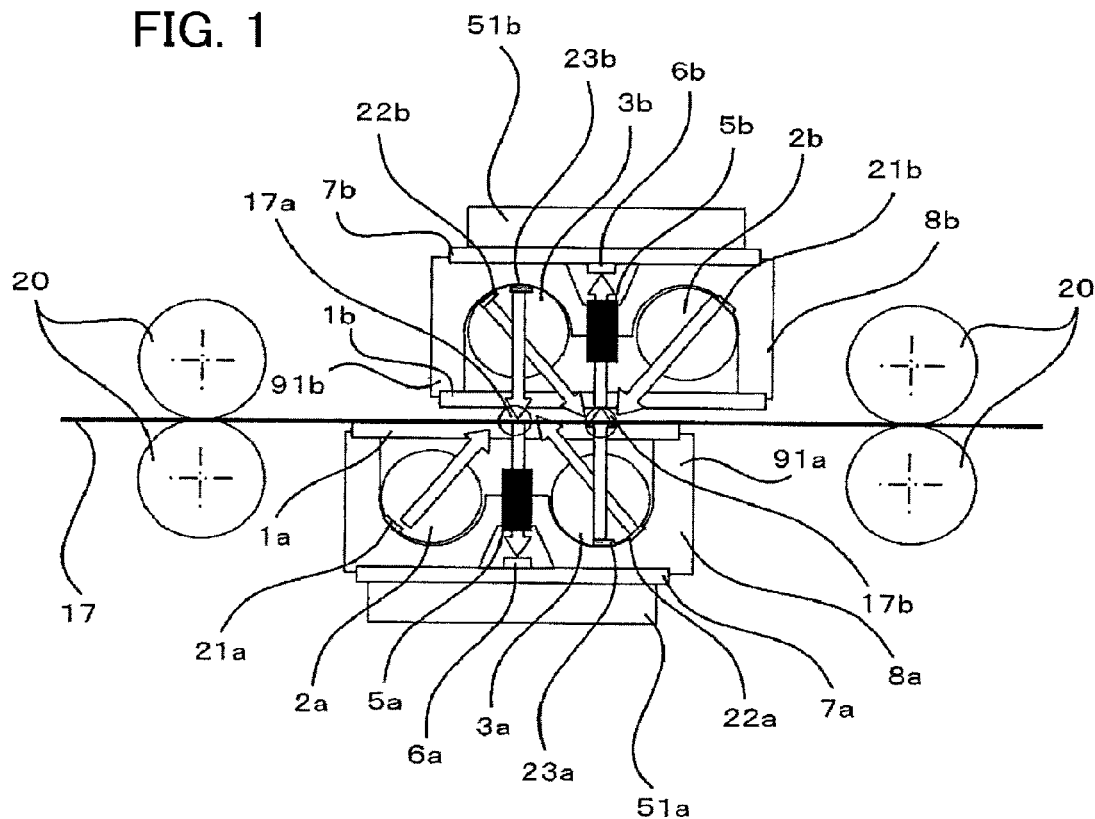
FIG. 1 is a sectional view of an image sensor device according to Embodiments 1 and 4 of the present disclosure.

Hereinafter, the image sensor and image sensor device according to Embodiment 1 of the present disclosure are explained. FIG. 1 is a sectional view of the image sensor device according to Embodiment 1. In the embodiment of the present disclosure, the reference sign 17 denotes a paper leaf such as a currency note, negotiable securities, or a check to be read, the paper leaf being located to the exterior of the image sensor device, and having reflected light information and transmitted light information such as a watermark and the like.

As shown in FIG. 1, the image sensor device is arranged such that two image sensors 91a and 91b having an identical external shape and identical structure are rotated 180 degrees relative to one another around an axis parallel to the main scanning direction to face each other in vertical direction across the paper leaf 17, and each of top glass plates 1a and 1b are arranged to face each other at a predetermined distance. Moreover, the paper leaf 17 is configured such that the paper leaf 17 can be conveyed in the gap formed between the top glass plates 1a and 1b in the horizontal direction (the sub-scanning direction) on FIG. 1 by a conveyor system using rollers 20 disposed on the upper position and lower position in the conveying direction. Reading the image of the paper leaf 17 is achieved by conveying the paper leaf 17 at a predetermined speed and simultaneously driving and scanning the upper and lower image sensors 91a and 91b.

The two image sensors 91a and 91b shown in FIG. 1 have an identical outer shape and identical structure regarding fundamental configuration. Thus, the image sensor structure is described focusing on the lower image sensor 91a in FIG. 1 (hereafter symbols in the parentheses show component parts of the upper image sensor 91b). In the image sensor 91a (91b), the reference sign 1a (1b) denotes a top glass plate; the reference signs 2a (2b) and 3a (3b) denote light guides having a circular cross section that illuminate the paper leaf 17 over the glass plate 1a (1b); the reference signs 21a (21b), 22a (22b) and 23a (23b) denote light scattering portions that reflect and scatter light, and that are formed over a part of the outer periphery of the light guides 2a (2b) and 3a (3b) and over the approximately whole reading width; the reference sign 5a (5b) denotes a rod lens array that images the reflected light and the transmitted light from the paper leaf 17; the reference sign 6a (6b) denotes a one-dimensional photoelectric conversion element array that converts the imaged optical information into an electrical signal; the reference sign 7a (7b) denotes a printed circuit board that mounts a one-dimensional photoelectric conversion element array, the reference sign 51a (51b) denotes a signal processor mounted in the printed circuit board 7a (7b); and the reference sign 8a (8b) denotes a housing that holds these components.

Figure 2:
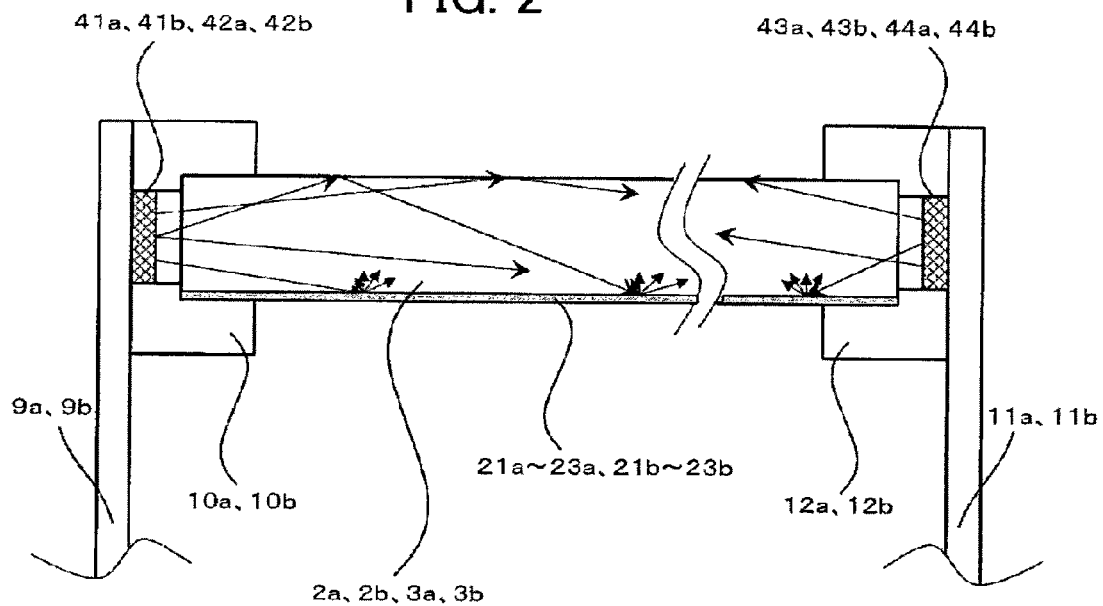
FIG. 2 is a side sectional view of a lighting device according to Embodiments 1 to 4 of the present disclosure.
Figure 3A:
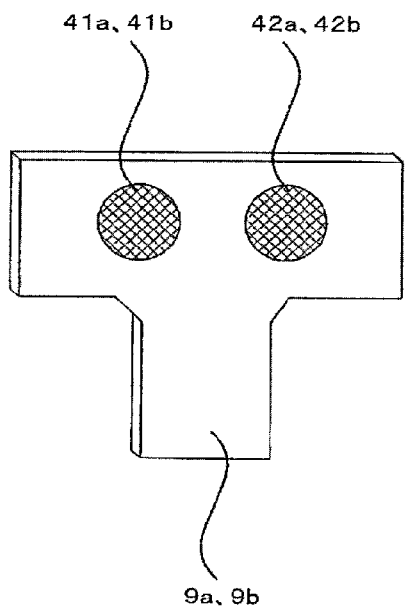
FIG. 3A is a diagram showing a flexible printed circuit board according to Embodiments 1 and 4 of the present disclosure.
Figure 3B:
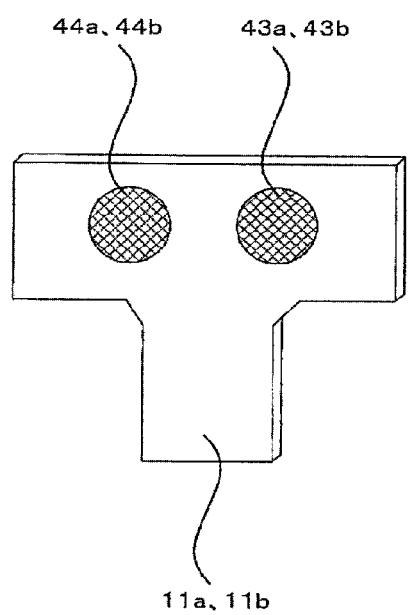
FIG. 3B is a diagram showing a flexible printed circuit board according to Embodiments 1 and 4 of the present disclosure.

Next, a lighting device is explained. The side sectional view of the lighting device according to Embodiment 1 is shown in FIG. 2. In FIG. 2, the reference signs 9a (9b) and 11a (11b) denote flexible printed circuit boards on which a light source (LED) is mounted, and the reference signs 10a (10b) and 12a (12b) denote holders that are positioned between the light guides 2a (2b) and 3a (3b) and the flexible printed circuit boards 9a (9b) and 11a (11b) respectively, the holders holding both the light guides and the flexible printed circuit boards. In FIG. 3A and FIG. 3B, the LEDs are mounted such that the optical axes of the LED are directed to the axis directions of the light guides 2a (2b) and 3a (3b) in mounting regions 41a-44a (41b -44b) of the flexible printed circuit boards 9a (9b) and 11a (11b). The mounting regions 42a (42b) and 44a (44b) correspond to the light guide 2a (2b), and the mounting regions 41a (41b) and 43a (43b) correspond to the light guide 3a (3b). Moreover, the emission wavelength of the LED is within a wavelength range in which the above-mentioned one-dimensional photoelectric conversion element array has sensitivity. Depending on detection specifications, one type of LED or several types of LEDs having different wavelengths are mounted, and are controlled to be turned on/off by the signal processor 51a (51b) via the flexible printed circuit boards 9a (9b) and 11a (11b) for each type of LEDs. In addition, FIG. 3A shows the flexible printed circuit board 9a (9b). FIG. 3B shows the flexible printed circuit board 11a (11b).

Function and effects of Embodiment 1 are explained. FIGS. 3A and 3B are flexible printed circuit board diagrams according to Embodiment 1 of the present disclosure. In FIG. 2 and FIG. 3A (FIG. 3B), the light, emitted from the LED mounted in the mounting regions 41a-44a (41b-44b) of the flexible printed circuit boards 9a (9b) and 11a (11b), enters into the light guides 2a (2b) and 3a (3b) that are held by the holders 10a (10b) and 12a (12b) so as to come close to the light source.

Figure 4A:
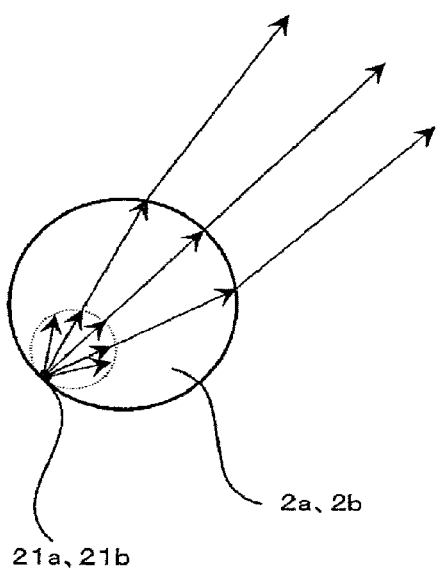
FIG. 4A is a sectional view of a light guide according to Embodiments 1 and 4 of the present disclosure.
Figure 4B:
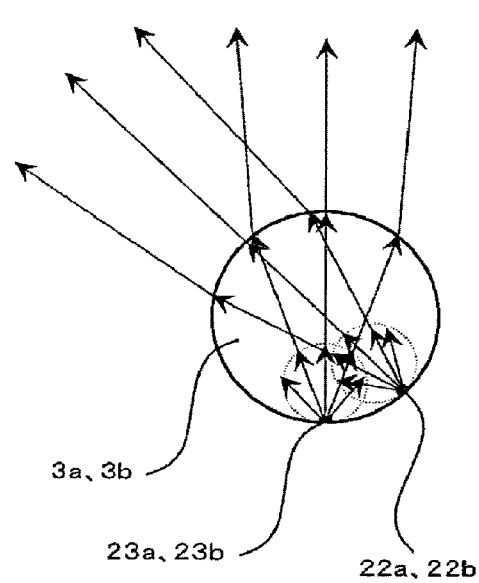
FIG. 4B is a sectional view of a light guide according to Embodiment 1 and 4 of the present disclosure.

As the entered light beams being totally reflected on the inner surface of the light guide and being propagated in the interior of the light guide, some light beams are scattered at the light scattering portions 21a-23a (21b-23b) being at a portion of the outer periphery of the light guide and extending in the reading width direction (the depth direction of the paper surface of FIG. 1) that are arranged at the position opposed to the regions 17a and 17b on the paper leaf 17 and on the optical axis of the rod lens array 5a (5b). The sectional views of the light guides 2a (2b) and 3a (3b) are shown in FIGS. 4A and 4B. The light scattered at the light scattering portions 21a-23a (21b-23b) is emitted in the opposite direction with regard to the light scattering portion and the cross-sectional center according to the law of reflection and refraction of light, while obtaining a predetermined light focusing effect, and illuminates the paper leaf 17 in FIG. 1. FIG. 4A shows the light guide 2a (2b). FIG. 4B shows the light guide 3a (3b).

In FIG. 1, the light guides 2a and 3a of the lower image sensor 91a are disposed in the position in which respective light scattering portions 21a and 22a can efficiently illuminate the region 17a on the paper leaf 17 and on the optical axis of the rod lens array 5a at an angle of approximately 45 degrees. In addition, in the light guide 3a, the light scattering portion 23a which is disposed separately from the light scattering portion 22a is disposed in a position in which the light scattering portion 23a can efficiently illuminate the region 17b on the paper leaf 17 and on the optical axis of the rod lens array 5b of the upper image sensor 91b from the normal direction of the paper leaf.

Moreover, the light guides 2b and 3b of the upper image sensor 91b are disposed in the position in which respective light scattering portions 21b and 22b can efficiently illuminate the region 17b on the paper leaf 17 and on the optical axis of the rod lens array 5b at an angle of approximately 45 degrees. In addition, the light scattering portion 23b which is disposed separately from the light scattering portion 22b of the light guide 3b is disposed in the position in which the light scattering portion 23b can efficiently illuminate the region 17a on the paper leaf 17 and on the optical axis of the rod lens array 5a of the lower image sensor 91a from the normal direction of the paper leaf.

As being configured as mentioned above, the one-dimensional photoelectric conversion element array 6a of the lower image sensor 91a can receive the reflected light information from the region 17a on the paper leaf 17 illuminated with the light guides 2a and 3a of the lower image sensor 91a, and the transmitted light information from the region 17b on the paper leaf 17 illuminated with the light guide 3b of the upper image sensor 91b. The one-dimensional photoelectric conversion element array 6a can convert the received light to electric information which can be output outside via the signal processor 51a.

On the other hand, the one-dimensional photoelectric conversion element array 6b of the upper image sensor 91b can receive the reflected light information from the region 17b on the paper leaf 17 illuminated with the light guides 2b and 3b of the upper image sensor 91b, and the transmitted light information from the region 17a on the paper leaf 17 illuminated with the light guide 3a of the lower image sensor 91a. The one-dimensional photoelectric conversion element array 6b can convert the received light to electric information which can be output outside via the signal processor 51b.

In addition, each one-dimensional photoelectric conversion element array is to output electrical signals proportional to a convolved value of the spectral sensitivity spectrum of the array itself with the spectrum of either one of the reflected light information and transmitted light information received by the array. As the spectral sensitivity spectrum held by the one-dimensional photoelectric conversion element array itself is fixed (by the device), reflected light information and transmitted light information of different spectrum can be obtained by switching lightings having different emission spectra and scanning to one another.

By the way, as two light scattering portions are disposed at the light guides 3a and 3b, the area of the two light scattering portions is approximately twice of that of the light guides 2a and 2b. Thus, when intensities of all light sources whose light enters each one of the light guides 2a, 2b, 3a, and 3b are equal, illuminance in a case in which the light guides 3a and 3b illuminate the regions 17a and 17b respectively on the paper leaf 17 at an angle of 45 degrees is approximately ½ compared with that of the light guides 2a and 2b. Therefore, when it is necessary that the region 17a or 17b is illuminated equally on right and left sides at an angle of 45 degrees, the intensity of the light source corresponding to the light guides 3a and 3b is required to be set to twice of the intensity of the light source corresponding to the light guides 2a and 2b. Specifically, the lighting intensity can be compensated by setting the number of LEDs mounting in the mounting regions 41a (41b) and 43a (43b) to approximately twice of the number of LEDs mounted in the mounting regions 42a (42b) and 44a (44b), or by setting the driving current of LEDs mounted in the mounting regions 41a (41b) and 43a (43b) to approximately twice of the driving current of LEDs mounted in the mounting regions 42a (42b) and 44a (44b).

Figure 6:
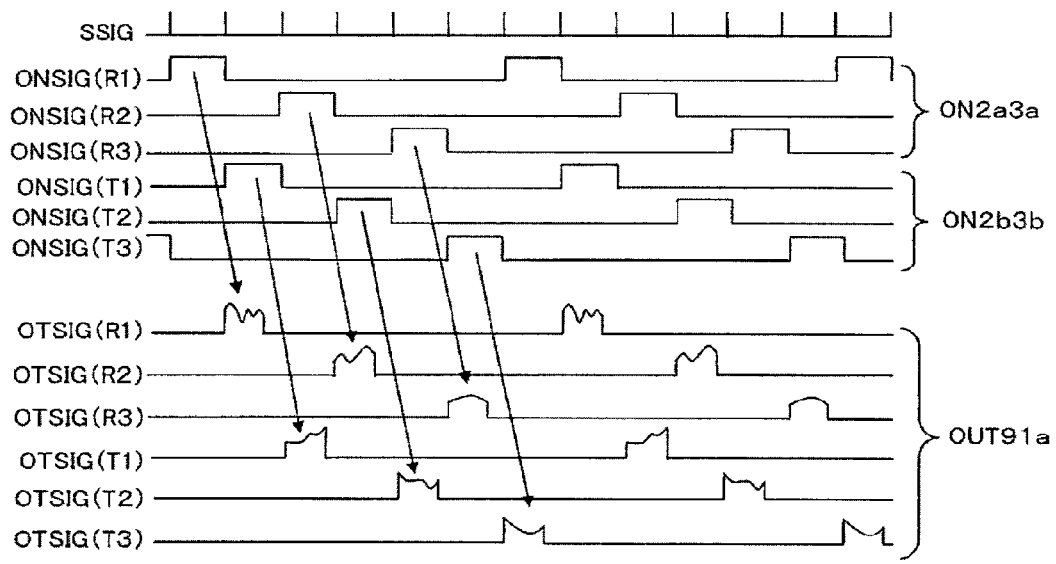
FIG. 6 is a timing diagram of the image sensor according to Embodiment 1 of the present disclosure.

Next, the relationship between the lighting timing of a light source and the output of an image sensor is explained. FIG. 6 shows the timing of operation of the image sensor 91a. In FIG. 6, SSIG indicates sub-scanning synchronized signals. ONSIG (R1) indicates lighting signals (reflected color 1). Similarly, ONSIG (R2) and ONSIG (R3) indicate lighting signals (reflected color 2) and lighting signals (reflected color 3), respectively. ONSIG (T1) indicates lighting signals (transmission color 1). Similarly, ONSIG (T2) and ONSIG (T3) indicate lighting signals (transmission color 2) and lighting signals (transmission color 3), respectively. OTSIG (R1) indicates output signals (reflected color 1). Similarly, OTSIG (R2) and OTSIG (R3) indicate output signals (reflected color 2) and output signals (reflected color 3), respectively. OTSIG (T1) indicates output signals (transmission color 1). Similarly, OTSIG (T2) and OTSIG (T3) indicate output signals (transmission color 2) and output signals (transmission color 3), respectively. In addition, a reflected color and a transmission color mean the wavelength of the light source. ON2a3a indicates the waveform corresponding to the light guides 2a and 3a. ON2b3b indicates the waveform corresponding to the light guides 2b and 3b. OUT91a indicates the waveform corresponding to the output of the image sensor 91a.

Operations are explained. Synchronizing with the SSIG, reflected colors and transmission colors are lighted up repeatedly in the order of ONSIG (R1), ONSIG (T1), ONSIG (R2), ONSIG (T2), ONSIG (R3), and ONSIG (T3). Thus, the output signal of the image sensor 91a is output in the order of OTSIG (R1), OTSIG (T1), OTSIG (R2), OTSIG (T2), OTSIG (R3), and OTSIG (T3). With reference also to FIG. 1, ONSIG (R1) and ONSIG (T1) are explained in detail. Following the lighting signal of ONSIG (R1), the light guides 2a and 3a of the image sensor 91a are lighted up, the light from the light guides 2a and 3a are scattered and reflected in the light scattering portion 21a and the light scattering portion 22a; and the light emitted at an angle of approximately 45 degrees from the light guides 2a and 3a is reflected in the region 17a, is received at the photoelectric conversion element array 6a and an output signal of OTSIG (R1) is output from the image sensor 91a. Then, following the lighting signal of ONSIG (T1), the light guides 2b and 3b of the image sensor 91b are lighted up, and the light from the light guides 2b and 3b are scattered and reflected in the light scattering portion 23b, and the approximately normally directed light emitted from the light guides 2a and 3a transmits the region 17a and is received at the photoelectric conversion element array 6a and an output signal of OTSIG (T1) is output simultaneously from the image sensor 91a. Similar operations are performed for the reflected colors 2 and 3 and the transmission colors 2 and 3.

Figure 7:
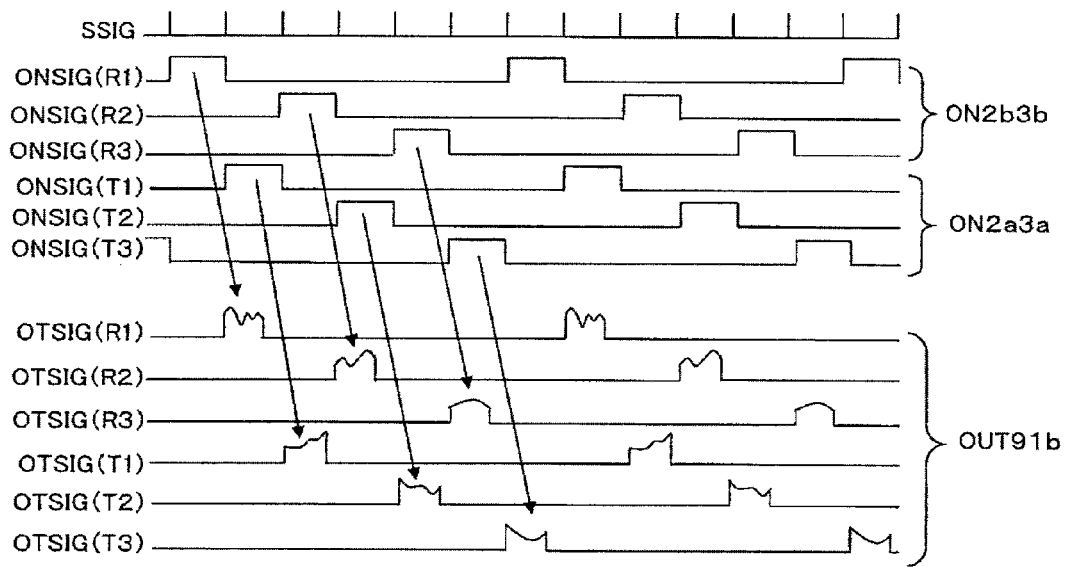
FIG. 7 is a timing diagram of the image sensor according to Embodiment 1 of the present disclosure.

The above explanation explains the case in which a total of three types of single wavelengths are mounted as light sources corresponding to the light guides 2a and 3a, and a total of three types of single wavelengths are mounted as light sources corresponding to the light guides 2b and 3b. Of course, the output of the one-dimensional photoelectric conversion element array, synchronizing with the scanning signal and corresponding to the types of the lighted up light sources, can be obtained in order of time by synchronizing the total of six types of light sources with the scanning signal and, by repeating lighting on and off sequentially. Similarly, as shown in FIG. 7, an output of the image sensor 91b can be obtained at similar timing. In FIG. 7, OUT91b indicates the waveform corresponding to the output of the image sensor 91b. The difference between FIG. 6 and FIG. 7 in abbreviated reference signs is OUT91a and OUT91b.

In this way, for example, the light guides 2b and 3b of the image sensor 91b is turned off at the timing of light sources having a certain wavelength of the light guides 2a and 3a of the image sensor 91a being turned on by performing synchronous control of the upper and lower image sensors 91a and 91b. For this reason, the transmitted light information corresponding to the illumination wavelength from a region which is a predetermined distance apart from the predetermined region on the paper leaf 17 can be obtained from the photoelectric conversion element array 6b at the same timing as the reflected light information corresponding to the illumination wavelength from the predetermined region on the paper leaf 17 is obtained from the photoelectric conversion element array 6a.

Figure 5:
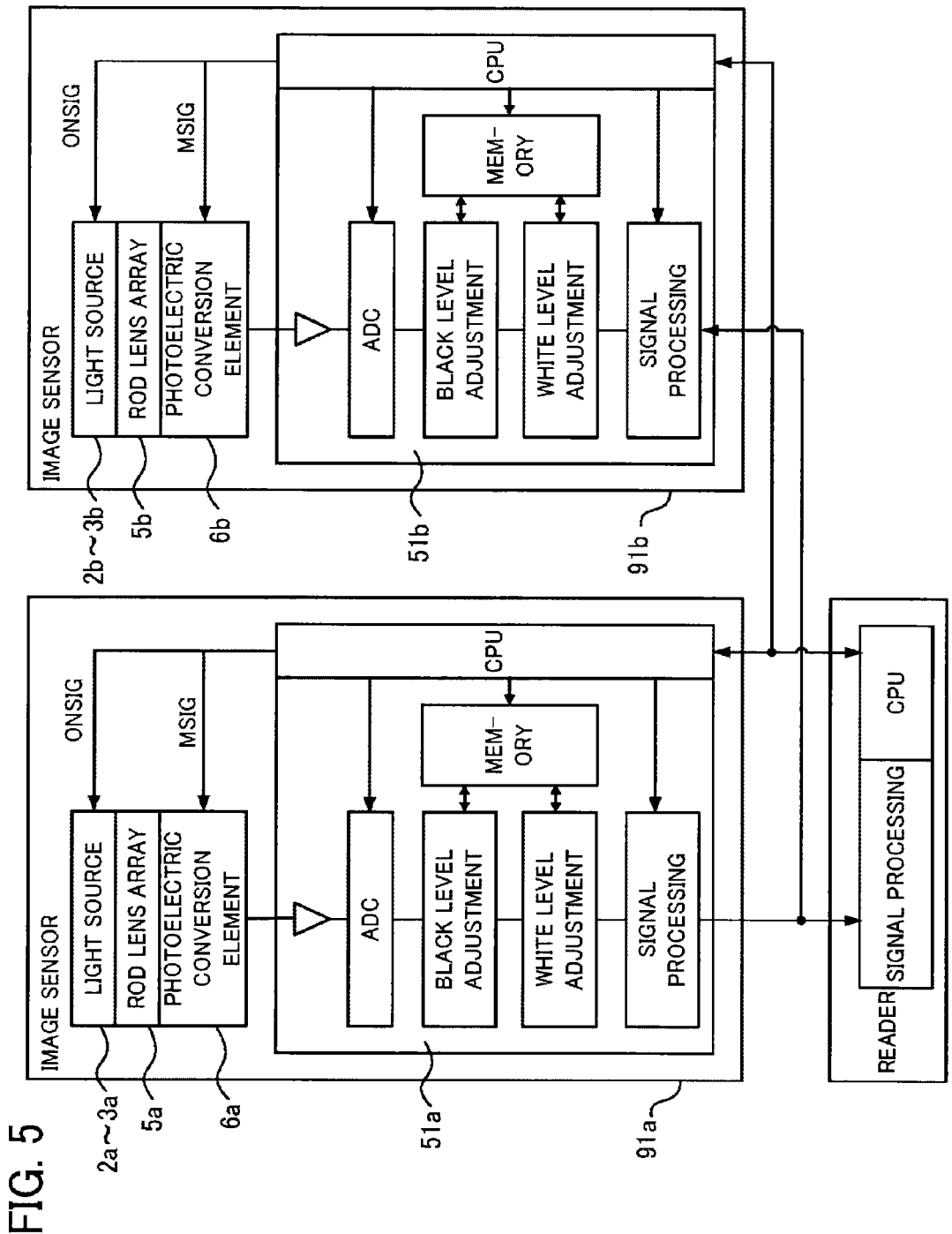
FIG. 5 is a whole block diagram according to Embodiment 1 of the present disclosure.

FIG. 5 is a whole block diagram according to Embodiment 1 of the present disclosure. In FIG. 5, ONSIG indicates a lighting signal. MSIG indicates the main scanning direction synchronized signal and the sub-scanning direction synchronized signal. Signal processors 51a and 51b are configured as shown in FIG. 5. The analog pixel sequential outputs that are output from the one-dimensional photoelectric conversion element arrays 6a and 6b are converted to digital outputs in an AD converter. Then, the A-to-D converted pixel sequential outputs are output externally after being treated by signal processing such as a black level adjustment processing that performs digital computing such that the black output uneven characteristic of one-dimensional photoelectric conversion element arrays is uniformed, and a white level adjustment processing that performs digital computing such that the uneven sensitivity characteristic of the one-dimensional photoelectric conversion element arrays and the uneven output characteristic due to the lighting system and the imaging system are uniformed.

An example is shown, regarding the image sensors (image sensor devices) according to Embodiment 1, in which three types of LEDs having different wavelengths are mounted on the lower image sensor 91a and the upper image sensor 91b. The types of wavelengths are not limited to this and the number of upper LEDs and lower LEDs can be different, and LEDs having different wavelengths can also be used.

As mentioned above, the image sensor (image sensor device) according to Embodiment 1 can detect the reflected light information and transmitted light information on the both sides of the paper leaf by using a pair of opposing image sensors in which a light source for reading reflected light and a light source for reading transmitted light are arranged in one housing. Also, the size of the optical detector in the reader can be reduced without sacrificing conveying quality.

Embodiment 2

Figure 8:
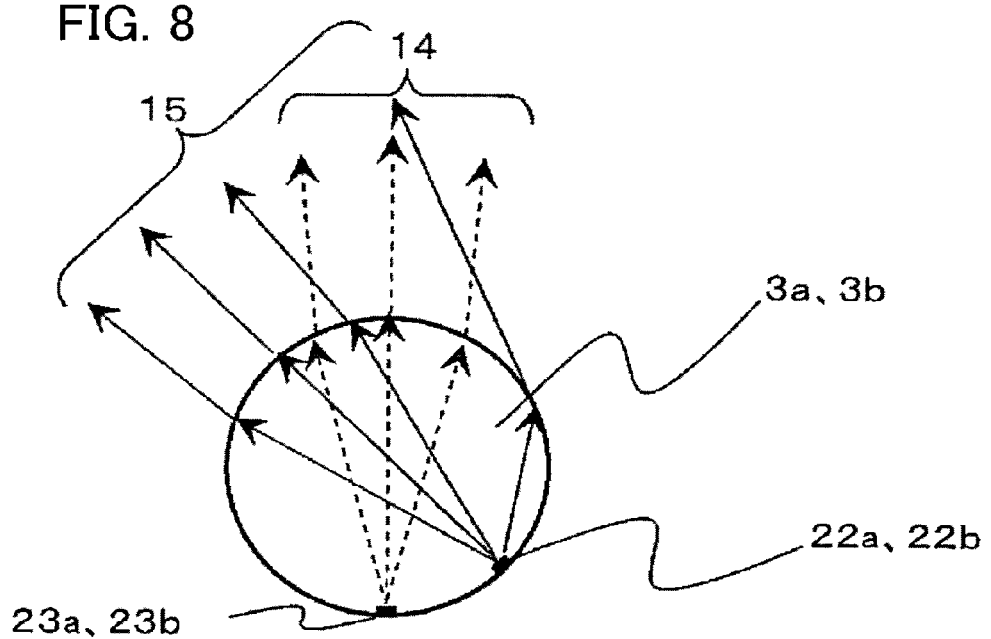
FIG. 8 is an optical-path diagram in a shorter-length direction of a light guide having no cut according to Embodiment 2 of the present disclosure.
Figure 9:
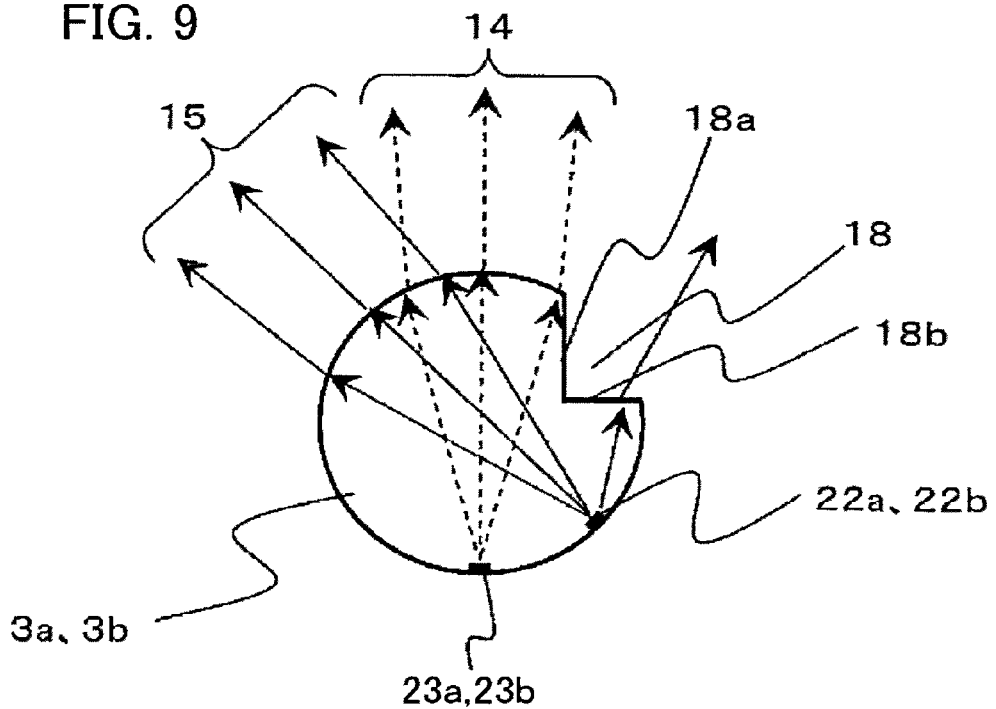
FIG. 9 is an optical-path diagram in a shorter-length direction of the light guide according to Embodiment 2 of the present disclosure.
Figure 10:
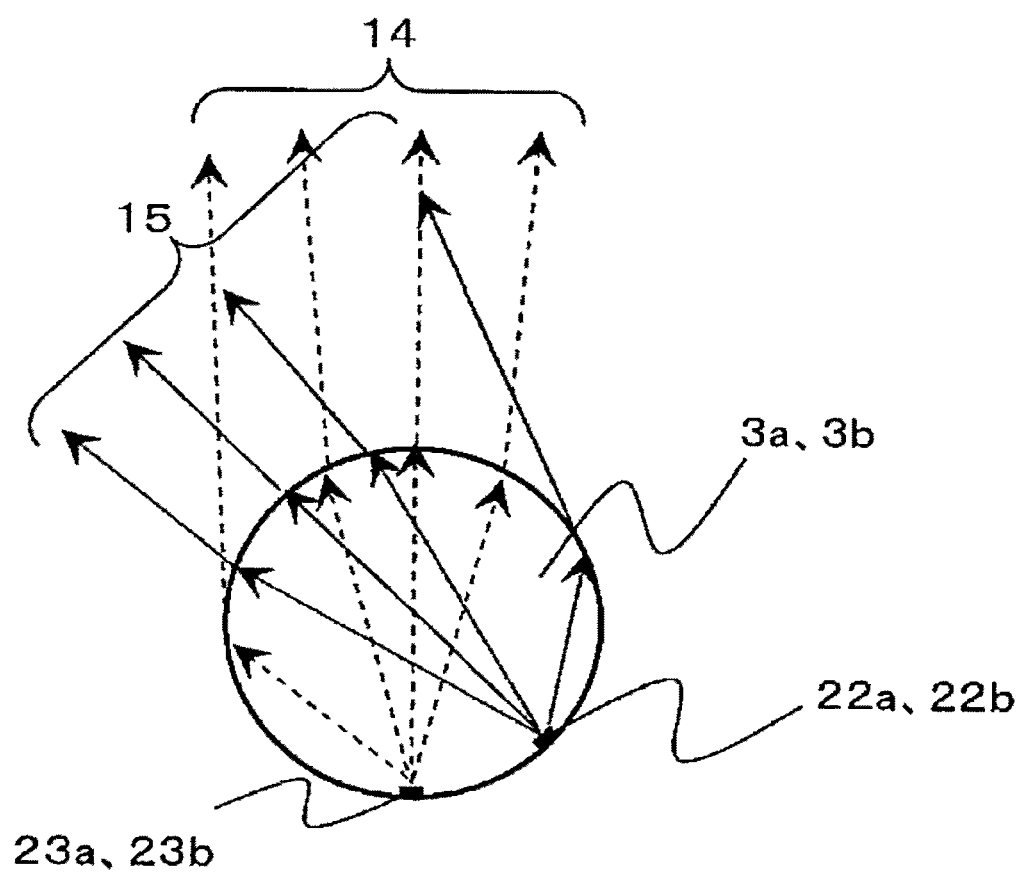
FIG. 10 is an optical-path diagram in a shorter-length direction of a light guide having no cut according to Embodiment 2 of the present disclosure.
Figure 11:
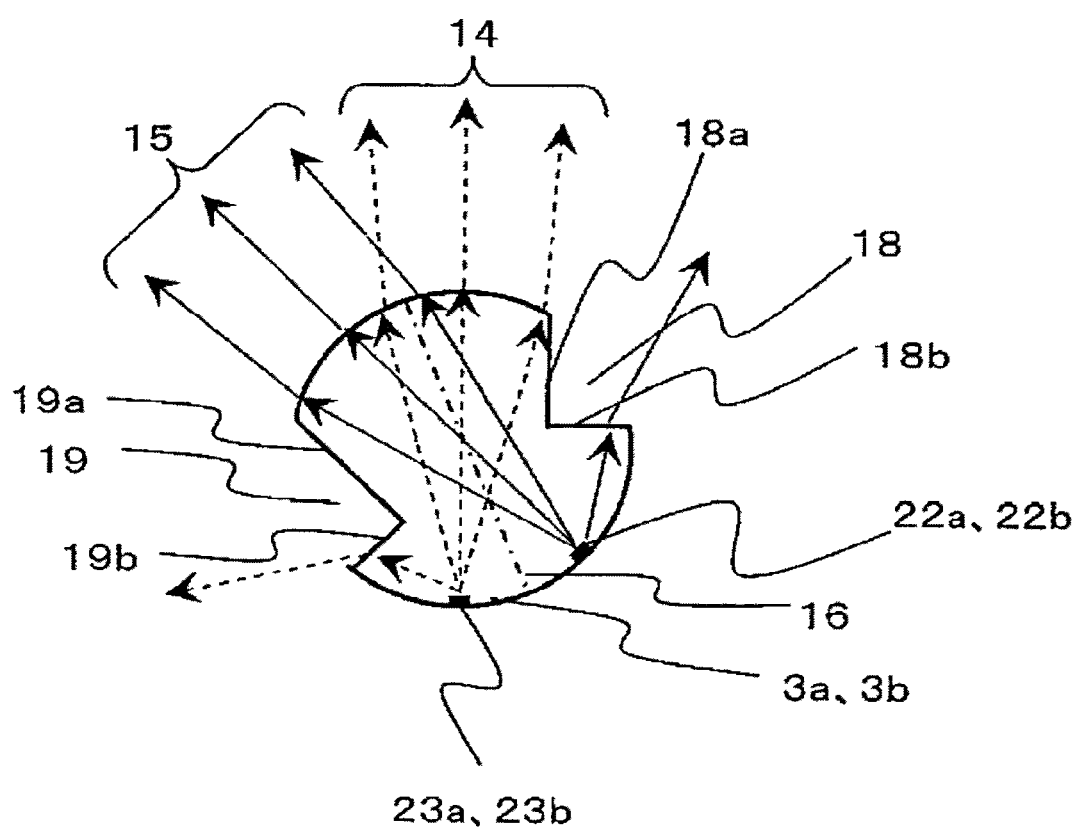
FIG. 11 is an optical-path diagram in a shorter-length direction of the light guide having two cuts according to Embodiment 2 of the present disclosure.
Figure 12:
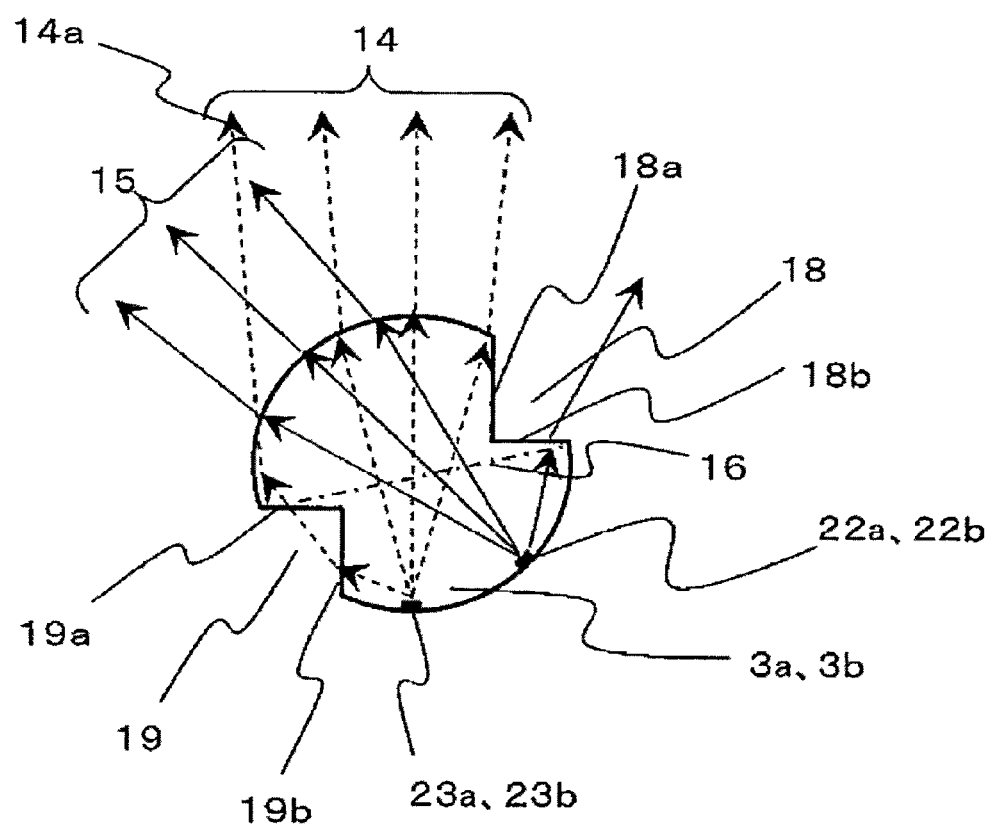
FIG. 12 is an optical-path diagram in a shorter-length direction of the light guide whose cutting direction is adjusted according to Embodiment 2 of the present disclosure.
Figure 13:
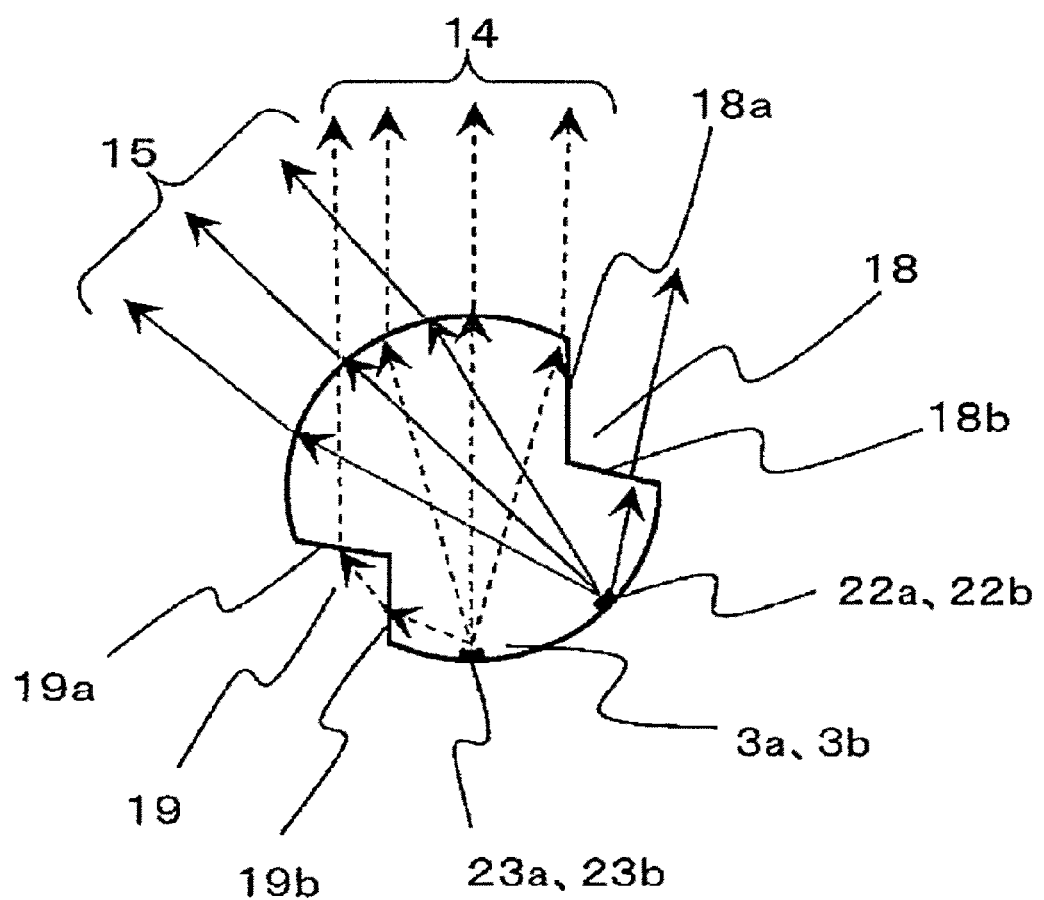
FIG. 13 is an optical-path diagram in a shorter-length direction of the light guide whose cutting direction is adjusted according to Embodiment 2 of the present disclosure.
Figure 14:
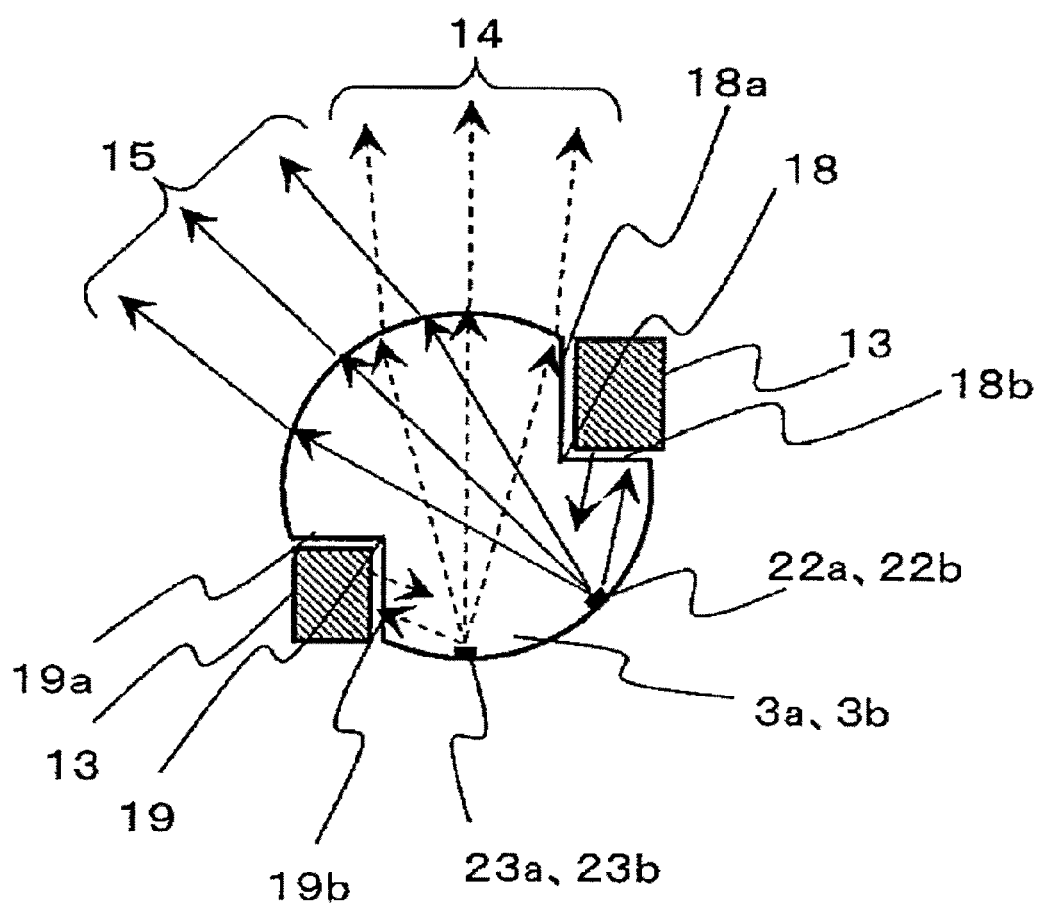
FIG. 14 is an optical-path diagram in a shorter-length direction of the light guide whose cuts are filled with light shielding members according to Embodiment 2 of the present disclosure.

Hereinafter, the image sensor and image sensor device according to Embodiment 2 are explained. FIG. 8 is an optical-path diagram in a shorter-length direction of a light guide having no cut according to Embodiment 2. FIG. 9 is an optical-path diagram in a shorter-length direction of the light guide according to Embodiment 2. FIG. 10 is an optical-path diagram in a shorter-length direction of a light guide having no cut according to Embodiment 2. FIG. 11 is an optical-path diagram in a shorter-length direction of the light guide having two cuts according to Embodiment 2. FIG. 12 is an optical-path diagram in a shorter-length direction of the light guide according to Embodiment 2 whose cutting direction is adjusted. FIG. 13 is an optical-path diagram in a shorter-length direction of the light guide whose cutting direction is adjusted according to Embodiment 2. FIG. 14 is an optical-path diagram in a shorter-length direction of the light guide whose cuts are filled with light shielding members according to Embodiment 2. The same reference signs are provided to the components in FIGS. 8-14 which are identical or equivalent components of FIG. 4, and the explanation thereof is omitted.

The cross section of the light guide 2 mounted on the housing 8 in Embodiment 1 is circular. Embodiment 2 is an embodiment in which the sectional shape is different. The light scattering portion 21 does not have a problem in particular when the degrees of scattering angles of the light scattering portions 22 and 23 are small with regard to the diameter of the section of one cylinder of the light guide 2 or the light guide 3. However, when the degree of scattering angle is large, the light scattered and reflected in the light scattering portions 22 and 23 is emitted from the light guide 3, and the light flux 14 to be incident perpendicularly to the paper leaf 17, and the light flux 15 to be incident at a certain angle, overlap with each other and are emitted on the paper leaf 17. Then, as illumination is performed with light fluxes having different irradiation angles, a problem that the amount of illuminating light varies largely may occur when the distance between the glass plate 1 and the paper leaf 17 changes due to flustering of the paper leaf 17 in the housing during conveying or wrinkles of the paper leaf 17.

FIG. 8 shows a case in which the scattering angle of the light scattering portion 22 is large. The light flux 14 and the light flux 15 are irradiated in overlap on the paper leaf 17. Thus, as shown in FIG. 9, cutting a cut (cut portion) 18 in the light guide 3 in the main scanning direction can block the optical path that causes the light flux 15 to spread, and can prevent an overlap of the light flux 14 and the light flux 15. That is, the light guide 3 has a cut 18 (cut portion) which is configured to extend in the main scanning direction and to have two planes, which are intersecting each other and are viewed as side surfaces from the sub-scanning direction, in the side surface between the light emitting region for the light flux 14 and the light scattering portion 22 for the light flux 15. In addition, the cut 18 is formed of crossing planar side surfaces 18a and 18b, the side surface 18a is orthogonal to the side surface 18b, and the side surface 18a of the cut 18 is parallel to the optical axis of the light flux 14. In addition, although not illustrated, when the degree of scattering angle of the light scattering portion 23 is also large, the light guide 3 has a cut 18 (cut portion) which is configured to extend in the main scanning direction and to have two planes, which are intersecting each other and are viewed as side surfaces from the sub-scanning direction, in the side surface between the light emitting region for the light flux 15 and the light scattering portion 23 for the light flux 14. In addition, the cut 18 is formed of crossing planar side surfaces 18a and 18b, the side surface 18a is at right angles to the side surface 18b, and the side surface 18a of the cut 18 is parallel to the optical axis of the light flux 15.

FIG. 10 shows a case in which the degree of scattering angles of both of the light scattering portions 22 and 23 are large. In this case also, as shown in FIG. 11, forming two cuts 18 and 19 in the light guide 3 in the main scanning direction can prevent an overlap of the light flux 14 and the light flux 15. That is, the light guide 3 has cuts 18 and 19 (cut portions) which are configured to extend in the main scanning direction and to have two planes, which are intersecting each other and are viewed as side surfaces from the sub-scanning direction, in the side surfaces between the light emitting region for the light flux 14 and the light scattering portion 22 for the light flux 15, and between the light emitting region for the light flux 15 and the light scattering portion 23 for the light flux 14. In addition, the cut 18 is formed of crossing planar side surfaces 18a and 18b, the side surface 18a is orthogonal to the side surface 18b, and the side surface 18a of the cut 18 is parallel to the optical axis of the light flux 14. The cut 19 is formed of crossing planar side surfaces 19a and 19b, the side surface 19a is orthogonal to the side surface 19b, and the side surface 19a of the cut 19 is parallel to the optical axis of the light flux 15.

Here, considering about manufacturing process of a light guide, to manufacture the shape as shown in FIG. 11, joint lines caused by jointed metallic molds exists in such a way that the center of the side surface of the light guide from which the light fluxes 14 and 15 are emitted is connected to the center of the light scattering portions 22 and 23. Thus, the joint lines in the light emitting portion of the light guide 3 may refract a part of the light fluxes 14 and 15. Thus, as a modification, as shown in FIG. 12, as a metallic mold can be pulled out in the direction parallel to the light flux 14 by changing one of the angles of the cuts 18 and 19 extending in the main scanning direction, joint lines are located except for the light emitting portion. That is, the cuts 18 and 19 are formed such that the side surface 18a of the cut 18 and the side surface 19b of the cut 19 are parallel to the optical axis of the light flux 14.

In the light guide 3 shown in FIG. 12, an optical path 14a may be generated and the light flux 14 may spread, and thus the light flux 14 may overlap with the light flux 15. Thus, as shown in FIG. 13, giving a certain angle to the cuts 18 and 19 that extend in the side surface of the light guide 3 can adjust the refraction direction, and prevent an overlap of the light fluxes 14 and 15. That is, the cuts 18 and 19 are formed such that the side surface 18a and the side surface 18b intersect with each other at an obtuse angle, and the side surface 19a and the side surface 19b intersect at an obtuse angle. In addition, the cuts 18 and 19 are formed such that the side surface 18a of the cut 18 and the side surface 19b of the cut 19 are parallel to the optical axis of the light flux 14.

Figure 15:
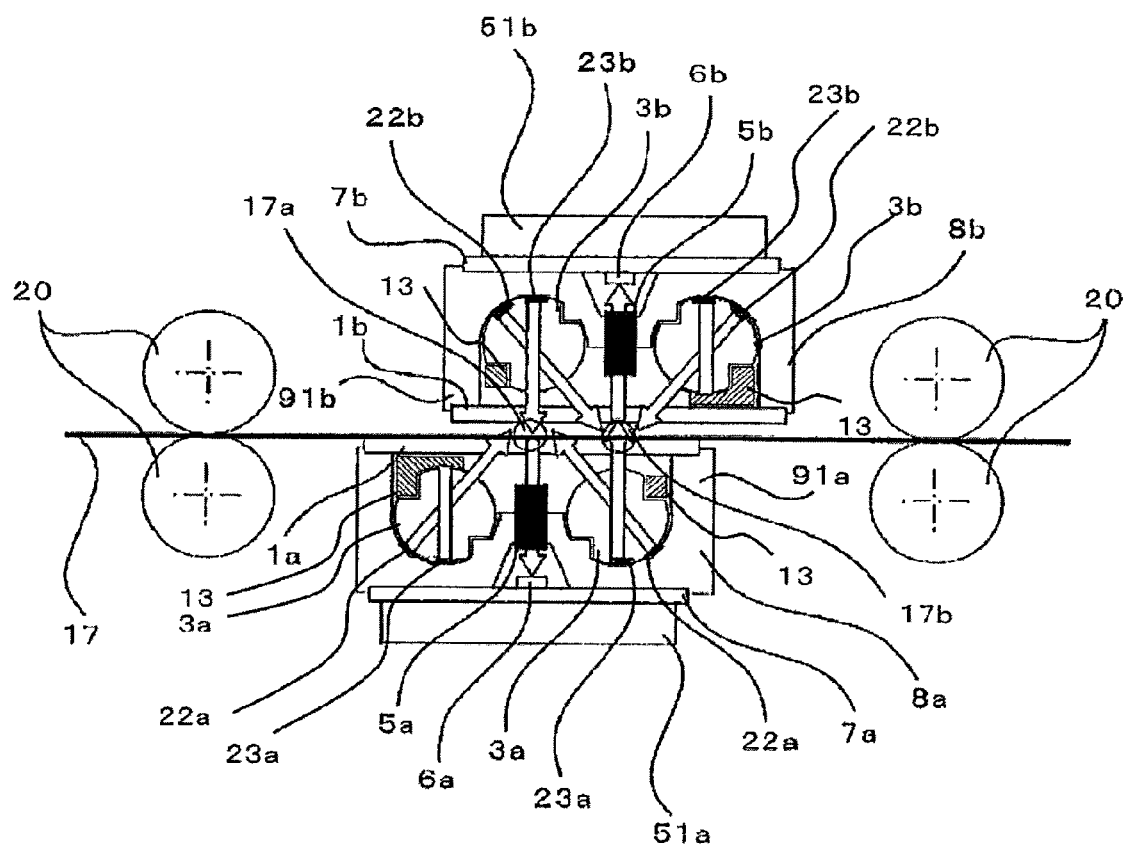
FIG. 15 is a sectional view of an image sensor device according to Embodiment 3 of the present disclosure.
Figure 16:
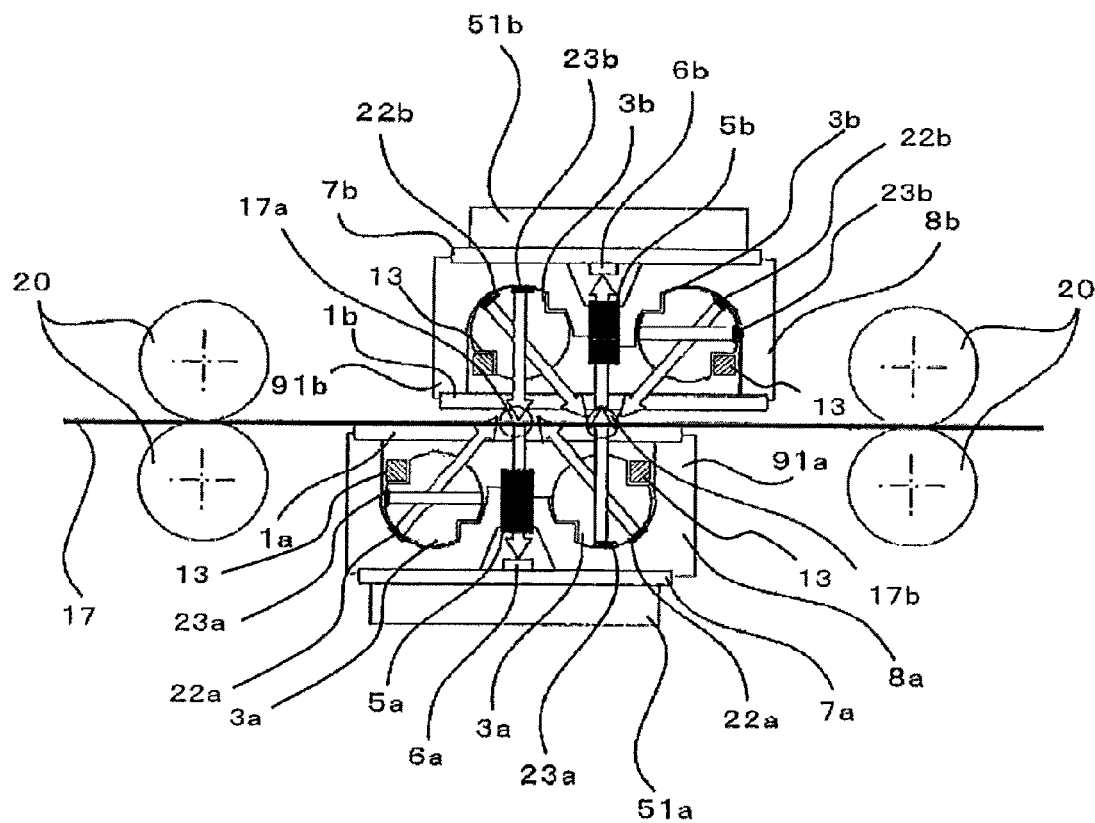
FIG. 16 is a sectional view of the image sensor device according to Embodiment 3 of the present disclosure.

Moreover, as shown in FIG. 14, the light shielding members 13 extending in the main scanning direction may be inserted for the cuts 18 and 19 of the light guide 3 to block the optical path. Then, the light shielding member 13 may be made of a material with high reflectance, such as white resin or metal, that can reflect the light leaked from the light guide 3 to the inside of the light guide. Thus, light can be emitted to the paper leaf 17 more efficiently. The difference between Embodiment 1 and Embodiment 2 is the shape of the light guide. In addition, as shown in FIG. 15 and FIG. 16, the shape of the housing 8 may be changed to perform the function of the light shielding member 13. The details of the image sensor (image sensor device) shown in FIG. 15 and FIG. 16 are explained in the subsequent Embodiment 3.

Embodiment 3

Hereinafter, the image sensor and image sensor device according to Embodiment 3 of the present disclosure are explained. FIG. 15 is a sectional view of the image sensor device according to Embodiment 3. FIG. 16 is a sectional view of the image sensor device according to Embodiment 3. In FIG. 15 and FIG. 16, the same reference signs are provided to components identical or equivalent to those of FIG. 1, and the explanation thereof is omitted.

As shown in FIG. 1 used for the explanation of the image sensor (image sensor device) according to Embodiment 1, in Embodiment 1, two types of light guides, the light guide 2 being provided with one light scattering portion 21 and the light guide 3 being provided with two light scattering portions, are mounted in the housing 8. On the other hand, Embodiment 3 is a case in which two light guides 3 in which the two light scattering portions 22 and 23 are arranged are mounted. FIG. 15 shows a case in which two light beams are emitted from the light guides 3 disposed in the housing 8 in a direction perpendicular to the reflected light reading position and the paper leaf 17. Moreover, FIG. 16 shows a case in which the emission directions of one light guide 3 are directed to the reflected light reading position and to the transmitted light reading position, and the emission directions of another light guide 3 are directed to the reflected light reading position and to the rod lens array 5.

In the image sensor (image sensor device) according to Embodiment 1, as shown in FIG. 1, when the light guide 2 is dedicated to reading of reflected light, the amounts of light emitted from the light guide 2 and the light guide 3 needs to be adjusted by the current passing through a light source, lighting time, or the number of light sources disposed. On the other hand, in the image sensor (image sensor device) according to Embodiment 3, as the same light guides 3 are mounted in FIG. 15 and FIG. 16, the same amount of light can be emitted from right and left onto the rod lens array 5 without fine adjustments. Therefore, there is a merit that can easily control the shadow of the reading image that is generated when the paper leaf 17 has unevenness such as wrinkles. Moreover, as no light guide 2 dedicated to reflection is required to be made, the cost can be reduced.

Embodiment 4

Figure 17:
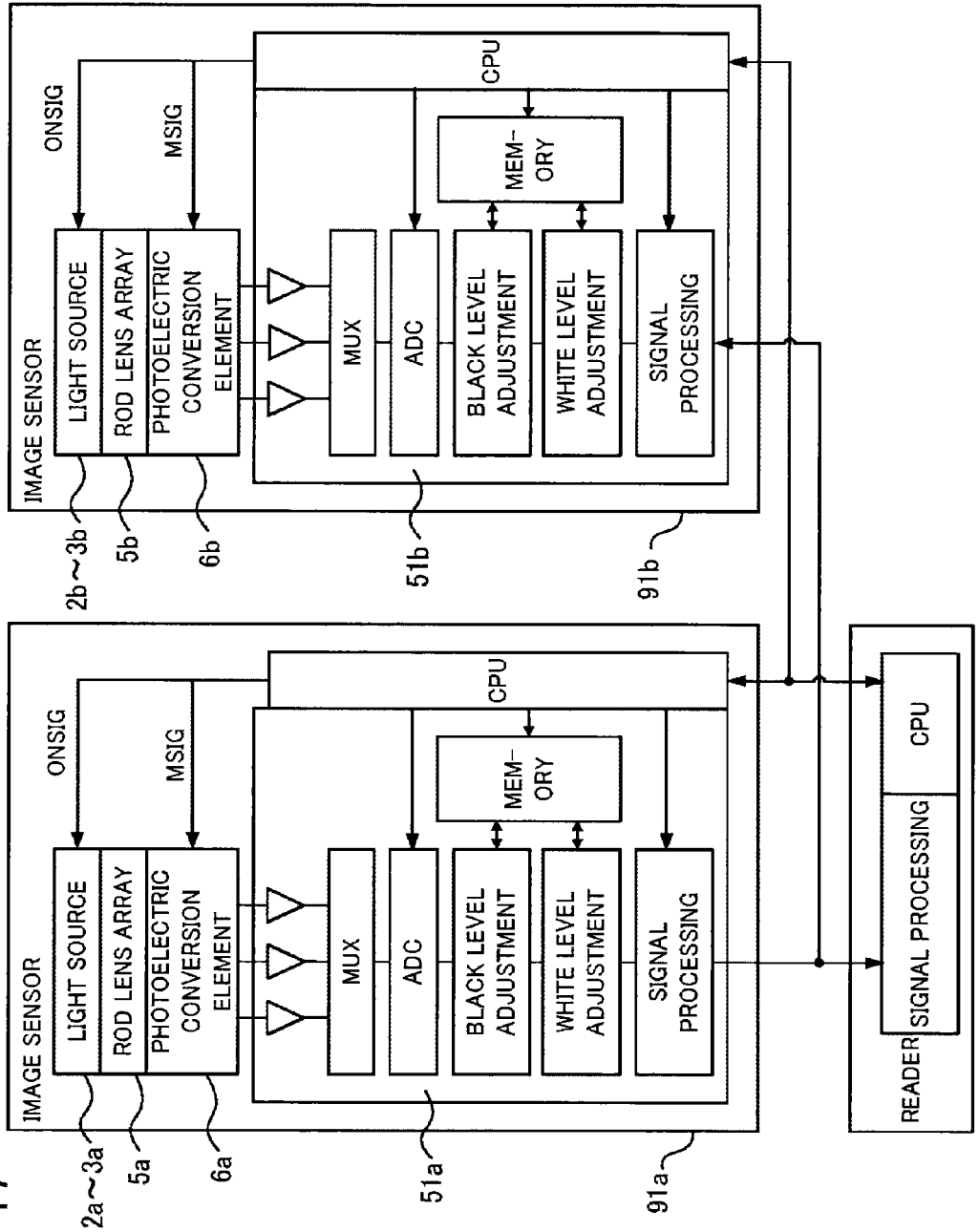
FIG. 17 is a whole block diagram according to Embodiment 4 of the present disclosure.
Figure 18:
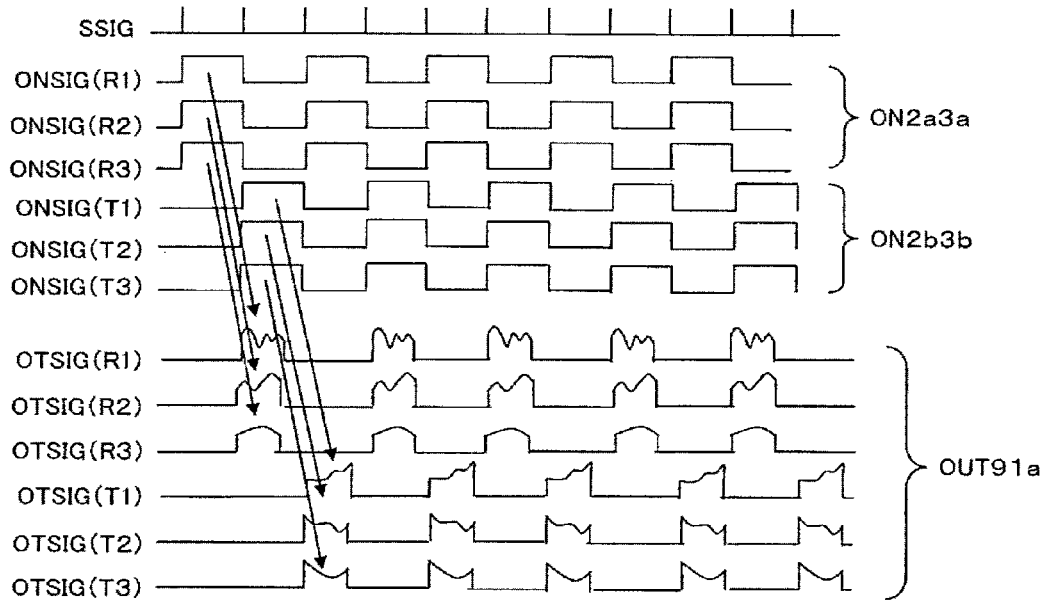
FIG. 18 is a timing diagram of the image sensor according to Embodiment 4 of the present disclosure.
Figure 19:
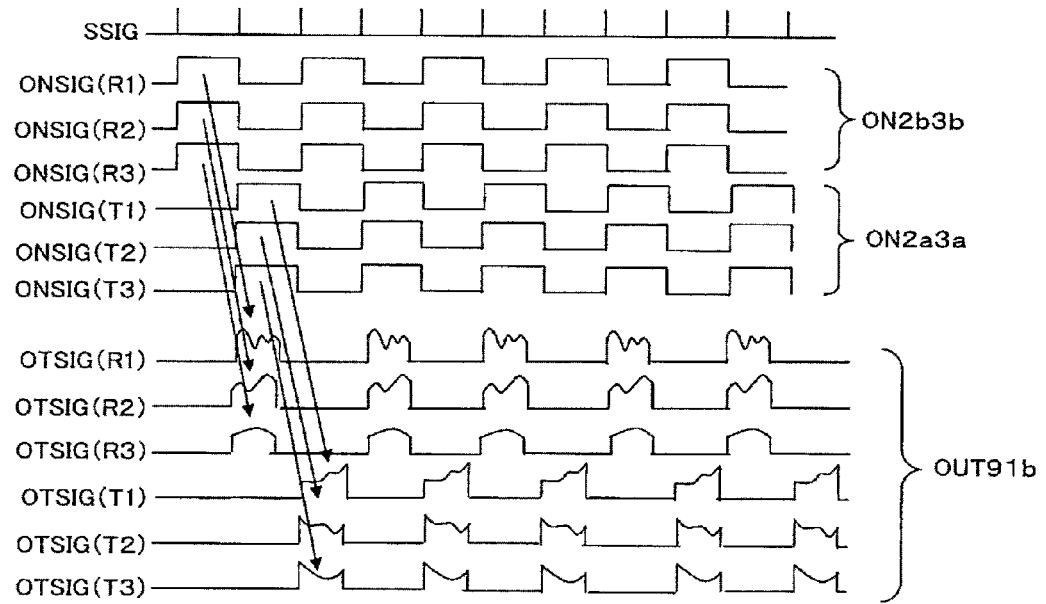
FIG. 19 is a timing diagram of the image sensor according to Embodiment 4 of the present disclosure.
Figure 20:
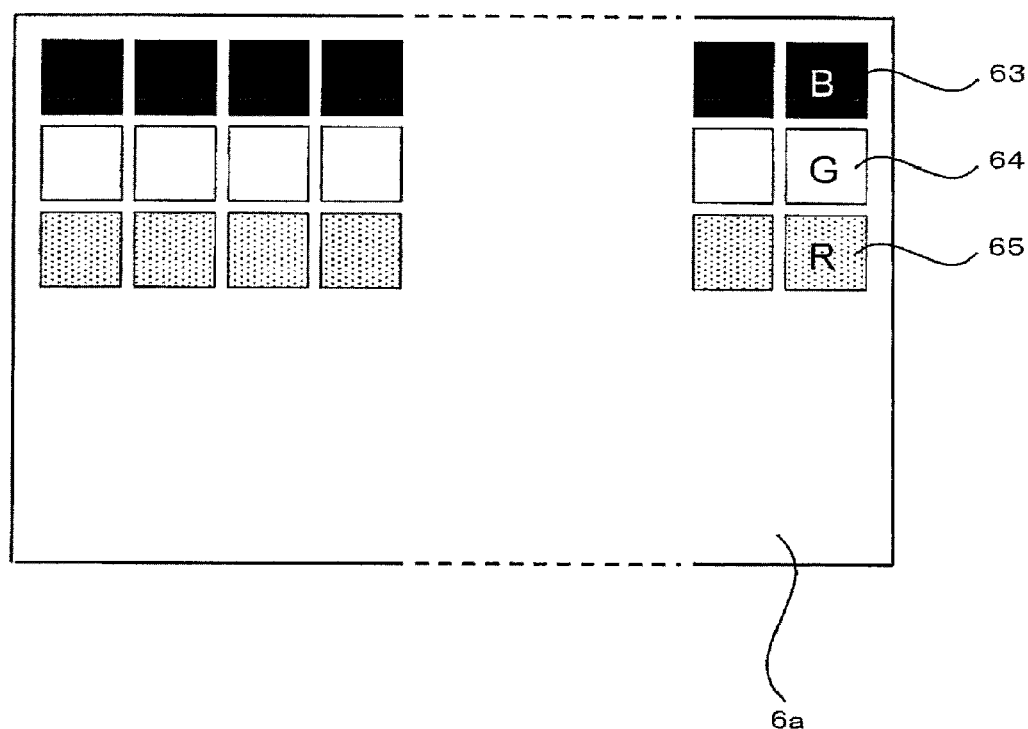
FIG. 20 is a diagram of a photoelectric conversion element array that is configured to have three columns having a spectral transmission spectrum filter according to Embodiment 4 of the present disclosure.

Hereinafter, the image sensor and image sensor device according to Embodiment 4 of the present disclosure are explained. FIG. 17 is a whole block diagram according to Embodiment 4. FIG. 18 and FIG. 19 are timing diagrams of the image sensor according to Embodiment 4. FIG. 20 is a diagram of a photoelectric conversion element array that is configured to have three columns having a spectral transmission spectrum filter according to Embodiment 4 of the present disclosure. In FIGS. 17-20, the same reference signs are provided to components identical or equivalent to those of FIGS. 5-7, and the explanation thereof is omitted.

In Embodiment 4, in place of the one-dimensional photoelectric conversion element array of Embodiment 1 of the present disclosure, a photoelectric conversion element array having three columns of one-dimensional photoelectric conversion element arrays is mounted in a direction perpendicular to a reading width direction as shown in FIG. 20. As filters having different spectral transmission spectrums (red, green, and blue in this case) from each other on the pixel light receiving portion in each column are formed, the photoelectric conversion element array in each column can convert only the optical information having a corresponding spectral transmission spectrum to an electrical signal among a set of optical information received by each array.

Similar to FIG. 5, FIG. 6, and FIG. 7, in FIG. 17, FIG. 18, and FIG. 19, ONSIGs indicate lighting signals. MSIG indicates a main scanning direction synchronized signal and a sub-scanning synchronized signal. SSIG indicates the sub-scanning synchronized signal. ONSIG (R1) indicates a lighting signal (reflected color 1). Similarly, ONSIG (R2) and ONSIG (R3) indicate a lighting signal (reflected color 2) and a lighting signal (reflected color 3), respectively. ONSIG (T1) indicates a lighting signal (transmission color 1). Similarly, ONSIG (T2) and ONSIG (T3) indicate a lighting signal (transmission color 2) and a lighting signal (transmission color 3), respectively. OTSIG (R1) indicates an output signal (reflected color 1). Similarly, OTSIG (R2) and OTSIG (R3) indicate an output signal (reflected color 2) and an output signal (reflected color 3), respectively. OTSIG (T1) indicates an output signal (transmission color 1). Similarly, OTSIG (T2) and OTSIG (T3) indicate an output signal (transmission color 2) and an output signal (transmission color 3), respectively. In addition, a reflected color and a transmission color mean the wavelength of a light source. ON2a3a indicates the waveform corresponding to the light guides 2a and 3a. ON2b3b indicates the waveform corresponding to the light guides 2b and 3b. OUT91a indicates the waveform corresponding to the output of the image sensor 91a. OUT91b indicates the waveform corresponding to the output of the image sensor 91b.

Also in Embodiment 4, similar to Embodiment 1, although LEDs as light sources having different emission wavelengths from one another are mounted, the lighting timings are different from Embodiment 1. That is, in Embodiment 1, output signals corresponding to each wavelength are obtained by repeatedly turning the LEDs having different wavelengths on and off in order of time sequentially. On the other hand, in Embodiment 4, the LEDs having different wavelengths are turned on simultaneously.

FIG. 18 shows the operation timing of the image sensor 91a. Also in this case, as light sources corresponding to the light guides 2a and 3a, LEDs that have a total of three types of single wavelengths are mounted, and as light sources corresponding to the light guides 2b and 3b, LEDs that have a total of three types of single wavelengths are mounted. Three types of light sources corresponding to the light guides 2a and 3a are controlled to turn on simultaneously, three types of light sources corresponding to the light guides 2b and 3b are controlled to turn on simultaneously, and the former light sources and the latter light sources are controlled to alternately and repeatedly turn on and off for every one scanning period, while synchronizing with a scanning signal. Each of the one-dimensional photoelectric conversion element arrays that have different spectral transmission spectrum from one another output electrical signals that are proportional to a convolved value of the spectral sensitivity spectrum of the array itself with the spectra of either one of the reflected light information and transmitted light information received by the array. As a result, optical information of light beams emitted from three types of light sources having different wavelengths, reflected irregularly and dispersed through three different types of filters are obtained simultaneously.

Simultaneous lighting of ONSIG (R1), ONSIG (R2), and ONSIG (R3) of reflected colors, and subsequent simultaneous lighting of ONSIG (T1), ONSIG (T2), and ONSIG (T3) of transmission colors are repeated synchronizing with the SSIG. Thus, regarding the output signal of the image sensor 91a, after the simultaneous output of OTSIG (R1), OTSIG (R2), and OTSIG (R3), OTSIG (T1), OTSIG (T2), and OTSIG (T3) are output simultaneously. This process is explained in detail with reference to FIG. 1. In response to the lighting signals of ONSIG (R1), ONSIG (R2), and ONSIG (R3), the light guides 2a and 3a of the image sensor 91a are lighted up, and the light emitted from the light guides 2a and 3a are scattered and reflected in the light scattering portion 21a and the light scattering portion 22a. The light emitted from the light guides 2a and 3a at an angle of approximately 45 degrees is reflected in the region 17a, is received at the photoelectric conversion element array 6a, and output signals of OTSIG (R1), OTSIG (R2), and OTSIG (R3) are output simultaneously from the image sensor 91a. Then, in response to the lighting signals of ONSIG (T1), ONSIG (T2), and ONSIG (T3), the light guides 2b and 3b of the image sensor 91b are lighted up, the light emitted from the light guides 2b and 3b are scattered and reflected in the light scattering portion 23b. The approximately normally directed light emitted from the light guides 2a and 3a and transmitting the region 17a, is received at the photoelectric conversion element array 6a and output signals of OTSIG (T1), OTSIG (T2), and OTSIG (T3) are output simultaneously from the image sensor 91a. As shown in FIG. 19, an output can also be obtained at similar timing from the image sensor 91b.

In this way, at the timing when the light sources corresponding to the light guides 2a and 3a of the image sensor 91a are turned on by performing synchronous control of the upper and lower image sensors 91a and 91b, the light source corresponding to the light guides 2b and 3b of the image sensor 91b are turned off. Therefore, the transmitted light information from the region which is predetermined distance apart from the predetermined region on the paper leaf 17 can be obtained from the photoelectric conversion element 6b at the same timing of the reflected light information from the predetermined region on the paper leaf 17 being obtained from the photoelectric conversion element 6a.

The signal processors 51a and 51b are configured as shown in FIG. 17, and three types of analog pixel sequential outputs that are outputs from the photoelectric conversion element arrays 6a and 6b are multiplexed in a multiplexer portion, and undergo digital conversion performed by the AD converter. Then, the A-to-D converted pixel sequential outputs are externally output after being treated by signal processing such as the black level adjustment processing that performs digital computing such that the black output uneven characteristic of each one-dimensional photoelectric conversion element array is uniformed, and the white level adjustment processing that performs digital computing such that the uneven sensitivity characteristic of the one-dimensional photoelectric conversion element array and the uneven output characteristic due to the lighting system and the imaging system are uniformed.

An example, in which three types of LEDs having different wavelengths together with the lower image sensor 91a and the upper image sensor 91b, is shown above. Wave length types are not limited to these. Different number of LEDs can be used for upper and lower LEDs, and LEDs having different wavelengths can be used. LEDs which are different from one another can be replaced with a white LED utilizing phosphor excitation.

As mentioned above, the image sensor (image sensor device) according to Embodiment 4 can detect reflected light information and transmitted light information on both sides of a paper leaf and can reduce the size of the optical detector in a reader without sacrificing conveying quality by using a pair of opposing image sensor in which a light source for reading reflected light and a light source for reading transmitted light are stored in a housing.

The relationship between the image sensors according to Embodiments 1 to 4 and the image sensor devices according to Embodiments 1 to 4 is explained. The image sensor devices according to Embodiments 1 to 4 are disposed such that the pairs of the image sensors according to Embodiments 1 to 4 are arranged point-symmetrically around an axis in the main scanning direction facing across the object-to-be-read, and the optical axis of the reflected light that is the inclined light of one image sensor (according to Embodiments 1 to 4) reflected at the object-to-be-read coincides with the optical axis of the transmitted light that is the normally directed light of the other image sensor (according to Embodiments 1 to 4) transmitted through the object-to-be-read.

Moreover, in the image sensor devices according to Embodiments 1 to 4, the pairs of the image sensors according to Embodiments 1 to 4 are arranged point-symmetrically around an axis in the main scanning direction facing across the object-to-be-read, the first irradiation region of one image sensor (according to Embodiments 1 to 4) is on the opposite side of the second irradiation region of the other image sensor (according to Embodiments 1 to 4), the first irradiation region of the other image sensor (according to Embodiments 1 to 4) is on the opposite side of the second irradiation region of the one image sensor (according to Embodiments 1 to 4), the rod lens array of the one image sensor (according to Embodiments 1 to 4) images synthesized light synthesizing reflected light, that is, the inclined light emitted from the irradiator of the one image sensor (according to Embodiments 1 to 4) and reflected in the second irradiation region of the one image sensor, with transmitted light, that is, the normally directed light emitted from the irradiator of the other image sensor (according to Embodiments 1 to 4) and transmitted the second irradiation region of one image sensor, and a rod lens array of the other image sensor (according to Embodiments 1 to 4) images synthesized light by synthesizing reflected light, that is, the inclined light emitted from the irradiator of the other image sensor (according to Embodiments 1 to 4) and reflected in the second irradiation region of the other image sensor (according to Embodiments 1 to 4), with transmitted light, that is, the normally directed light emitted from the irradiator of the one image sensor (according to Embodiments 1 to 4) and transmitted the second irradiation region of the other image sensor (according to Embodiments 1 to 4).

REFERENCE SIGNS LIST

1 Glass Plate
2 Light guide
3 Light guide
5 Rod lens array
6 Photoelectric conversion element array
7 Printed circuit board
8 Housing
9 Flexible printed circuit board
10 Holder
11 Flexible Printed circuit board
12 Holder
13 Light shielding member
14 Light flux
14a Light flux
15 Light flux
16 Joint line
17 Paper leaf
17a Region of paper leaf 17
17b Region of paper leaf 17
18 Cut (cut portion)
18a Side surface of cut 18
18b Side surface of cut 18
19 Cut (cut portion)
19a Side surface of cut 19
19b Side surface of cut 19
20 Roller
21-23 Light scattering portion (light reflection pattern)
41-44 Light source mounting portion
63 One-dimensional photoelectric conversion element array with blue filter
64 One-dimensional photoelectric conversion element array with green filter
65 One-dimensional photoelectric conversion element array with red filter
51 Signal-processor
91 Image sensor

The invention claimed is:

1. An image sensor device comprising a pair of image sensors, each of the image sensors including:
a lighting portion extending in a main scanning direction and irradiating light onto an object-to-be-read;

a rod lens array for imaging light from the object-to-be-read; and a light receiving portion for converting the light imaged by the rod lens array to an electric signal;

wherein the lighting portion emits a normally directed light from a normal direction of the object-to-be-read, to irradiate a first irradiation region of the object-to-be-read, and an inclined light inclined by a predetermined angle from the normal direction of the object-to- be-read to irradiate a second irradiation region being apart from the first irradiation region in a sub-scanning direction; and wherein the pair of the image sensors are arranged point-symmetrically around an axis in the main scanning direction facing across the object-to-be-read, and an optical axis of reflected light that is the inclined light of one image sensor reflected on the object-to-be-read, coincides with an optical axis of transmission light, that is, the normally directed light of the other image sensor transmitted through the object-to-be-read; and the lighting portion of one image sensor irradiates light at a timing different from the irradiating of the lighting portion of the other image sensor; and the light receiving portion of the one image sensor converts the reflected light and the light receiving portion of the other image sensor converts the transmission light during irradiation of light by the lighting portion of the one image sensor.

2. The image sensor device according to claim 1, wherein the lighting portion comprises:

a rod-shaped light guide extending in the main scanning direction, propagating light entered from the end thereof in the main scanning direction;

a light source being arranged at an end of the light guide in the main scanning direction, and inputting light to the end of the light guide; and two columns of light reflection patterns in the main scanning direction, each reflecting and scattering light entered from the end of the light guide, and emitting the light from a light emitting region of the light guide, wherein one of the two columns of the light reflection pattern emits the inclined light and another column of the light reflection pattern emits the normally directed light.

3. The image sensor device according to claim 2, wherein the light guide has a cut portion which is configured to extend in the main scanning direction and to have two planes, intersecting each other in the side surface between the light emitting region for the normally directed light and the light reflection pattern of the inclined light.

4. The image sensor device according to claim 3, wherein one of the two planes of the cut portion that is arranged on the side surface between the light emitting region for the normally directed light of the light guide and the light reflection pattern of the inclined light and that extends in the main scanning direction, is parallel to the optical axis of the normally directed light.

5. The image sensor device according to claim 2, wherein the light guide has a cut portion which is configured to extend in the main scanning direction and to have two planes, intersecting each other in the side surface between the light emitting region for the inclined light and the light reflection pattern of the normally directed light.

6. The image sensor device according to claim 5, wherein one of the two planes of the cut portion that is arranged on the side surface between the light emitting region for the inclined light of the light guide and the light reflection pattern of the normally directed light and that extends in the main scanning direction, is parallel to the optical axis of the inclined light.

7. The image sensor device according to claim 2, wherein the light guide has cut portions which are configured to extend in the main scanning direction and to have two planes, intersecting each other in the side surfaces between the light emitting region for the normally directed light and the light reflection pattern of the inclined light, and between the light emitting region for the inclined light and the light reflection pattern of the normally directed light.

8. The image sensor device according to claim 7, wherein one of the two planes of the cut portion that is arranged on the side surface between the light emitting region for the normally directed light of the light guide and the light reflection pattern of the inclined light and that extends in the main scanning direction, is parallel to the optical axis of the normally directed light; and one of the two planes of the cut portion that is arranged on the side surface between the light emitting region for the inclined light of the light guide and the light reflection pattern of the normally directed light and that extends in the main scanning direction, is parallel to the optical axis of the inclined light.

9. The image sensor device according to claim 8, wherein an intersecting angle of intersecting planes of the cut portion is 90 degrees.

10. The image sensor device according to claim 9, wherein a light shielding member is arranged at the cut portion.

11. The image sensor device according to claim 8, wherein an intersecting angle of intersecting planes of the cut portion is an obtuse angle.

12. The image sensor device according to claim 7, wherein one of the two planes of the cut portion that is arranged on the side surface between the light emitting region of the normally directed light of the light guide and the light reflection pattern of the inclined light and that extends in the main scanning direction, is parallel to the optical axis of the normally directed light.

13. The image sensor device according to claim 7, wherein one of the two planes of the cut portion that is arranged on the side surface between the light emitting region of the inclined light of the light guide and the light reflection pattern of the normally directed light and that extends in the main scanning direction, is parallel to the optical axis of the inclined light.

14. The image sensor device according to claim 1, wherein the lighting portion has a plurality of light sources having different wavelengths from one another;

the light receiving portion has a plurality of columns of photoelectric conversion element groups in the main scanning direction, and filters having transmission spectrums that are different in each of the columns are formed on the plurality of columns of the photoelectric conversion elements, and the image sensor reads photoelectric conversion signals in a unit of column.

15. The image sensor device wherein according to claim 14, wherein:

the set of all of the light sources of one image sensor irradiates light at different timing from irradiating of the set of all of the light sources of the other image sensor.

16. The image sensor device according to claim 1, wherein the lighting portion has a white light source using phosphor excitation; and the light receiving portion has a plurality of columns of photoelectric conversion element groups in the main scanning direction; and filters having transmission spectrums that are different in each of the columns are formed on the plurality of columns of the photoelectric conversion elements, and the image sensor reads photoelectric conversion signals in a unit of column.

17. The image sensor device according to claim 1, wherein the lighting portion has a plurality of light sources having different wavelengths from one another; and the plurality of light sources of one image sensor and the plurality of light sources of the other image sensor each irradiates light at different timing from one another at every wavelength.

\* \* \* \* \*